United States Patent
Nakamura

(10) Patent No.: US 11,211,769 B2
(45) Date of Patent: Dec. 28, 2021

(54) SEMICONDUCTOR LASER DEVICE

(71) Applicant: Mitsubishi Electric Corporation, Tokyo (JP)

(72) Inventor: Naoki Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/629,684

(22) PCT Filed: Nov. 17, 2017

(86) PCT No.: PCT/JP2017/041526
§ 371 (c)(1),
(2) Date: Jan. 9, 2020

(87) PCT Pub. No.: WO2019/097686
PCT Pub. Date: May 23, 2019

(65) Prior Publication Data
US 2020/0274317 A1    Aug. 27, 2020

(51) Int. Cl.
*H01S 5/10*    (2021.01)
*H01S 5/028*    (2006.01)
(Continued)

(52) U.S. Cl.
CPC ............ *H01S 5/028* (2013.01); *H01S 5/0203* (2013.01); *H01S 5/0287* (2013.01);
(Continued)

(58) Field of Classification Search
CPC ... H01S 5/1082; H01S 5/0207; H01S 2301/18
See application file for complete search history.

(56) References Cited

U.S. PATENT DOCUMENTS 4,794,608 A * 12/1988 Fujita .................... H01S 5/0014
372/45.01
5,294,815 A * 3/1994 Iechi .................... H01L 27/153
257/80
(Continued)

FOREIGN PATENT DOCUMENTS

JP    S63318183 A    12/1988
JP    H06152074 A    5/1994
(Continued)

OTHER PUBLICATIONS

International Search Report; Written Opinion; and Notification of Transmittal of the International Search Report and the Written Opinion of the International Searching Authority, or the Declaration issued in PCT/JP2017/041526; dated Jan. 9, 2018.
(Continued)

*Primary Examiner* — Tod T Van Roy
(74) *Attorney, Agent, or Firm* — Studebaker & Brackett PC

(57) ABSTRACT

A front facet of the semiconductor laser device includes a resonator facet portion containing an end of an active layer, and a protruding portion which protrudes beyond the resonator facet portion in a resonator length direction by a predetermined protrusion amount and has a stepped bottom surface portion. The resonator facet portion and the stepped bottom surface portion are connected to each other to form a corner portion. The distance from a thickness center position of the active layer to the stepped bottom surface portion is defined by a bottom surface portion depth. The bottom surface portion depth is set to be equal to a predetermined specific depth or deeper than the specific depth.

3 Claims, 11 Drawing Sheets

(51) Int. Cl.
    *H01S 5/02*     (2006.01)
    *H01S 5/20*     (2006.01)
    *H01S 5/042*    (2006.01)

(52) U.S. Cl.
    CPC .......... *H01S 5/1082* (2013.01); *H01S 5/2081* (2013.01); *H01S 5/04256* (2019.08); *H01S 5/1025* (2013.01); *H01S 2301/18* (2013.01)

(56) References Cited

U.S. PATENT DOCUMENTS

| | | | | |
|---|---|---|---|---|
| 5,362,673 | A | * | 11/1994 | Iechi ................... H01L 27/153 148/DIG. 99 |
| 5,608,749 | A | * | 3/1997 | Kizuki ................ H01S 5/0201 372/36 |
| 5,627,851 | A | * | 5/1997 | Takahashi ............ H01S 5/0207 372/44.01 |
| 2004/0233950 | A1 | | 11/2004 | Furukawa et al. |
| 2010/0091811 | A1 | * | 4/2010 | Behfar .................. G11B 7/127 372/50.23 |
| 2016/0268769 | A1 | * | 9/2016 | Stagarescu ......... H01S 5/02212 |

FOREIGN PATENT DOCUMENTS

| | | |
|---|---|---|
| JP | H1174615 A | 3/1999 |
| JP | 2001217497 A | 8/2001 |
| JP | 2009081336 A | 4/2009 |
| WO | 2002103865 A1 | 12/2002 |

OTHER PUBLICATIONS

Office Action issued in JP 2018-506227; mailed by the Japanese Patent Office dated Mar. 20, 2018.

* cited by examiner

A-A SECTION

B-B SECTION

SEMICONDUCTOR LASER DEVICE

FIELD

The present invention relates to a semiconductor laser device.

BACKGROUND

There has been conventionally known a semiconductor laser device in which a resonator facet is formed by etching as disclosed in WO 2002/103865 A1, for example. A Fabry-Perot type semiconductor laser device includes a resonator facet. The resonator facet serves to resonate light of an active layer inside a semiconductor layer to form a waveguide region. A cleavage method, an etching method, a polishing method, etc., are known as a method of forming the resonator facet. An appropriate forming method is selected according to a material.

CITATION LIST

Patent Literature

[PTL 1] WO 2002/103865 A1

SUMMARY

Technical Problem

A radiation pattern of laser light emitted from the resonator facet is called a far-field pattern. It is described on line 2 of page 6 in PTL 1 that an FFP, that is, a far-field pattern can be prevented from being disturbed in consideration of a radiation critical angle and the like. This point will be described. In the case where a resonator facet is first formed by dry etching, when dry etching stops halfway inside a semiconductor layer, a step occurs below the resonator facet. This step is a protruding portion protruding in a resonator length direction beyond the resonator facet. It is preferable to appropriately determine the depth of dry etching in relation to laser radiation so that the protruding portion does not hinder spread of laser output light. By preventing a traveling path of laser light output from the resonator facet from being hindered by the protruding portion, an excellent radiated light pattern can be obtained.

In a structure in which the resonator facet of a laser is formed by dry etching, it is necessary to consider not only output light, but also "the intensity distribution of laser light guided in the resonator". "The intensity distribution of laser light guided in the resonator" is generally called a near-field pattern. In the prior art document described above, no consideration is given to the light intensity distribution of the guided light. If a dry etching processing shape is designed without taking the relationship between the near-field pattern and the protruding portion into consideration, there is a risk that a large amount of the light distribution of the laser light reflected by the resonator facet is scattered. As a result, there has been a problem in that an optical loss increases excessively, which deteriorates the optical output characteristics of the laser.

The present application has been made to solve the above-described problem, and has an object to provide a semiconductor laser device that has been improved so that both a high light output and an excellent far-field pattern can be surely achieved.

Another object of the present application is to provide a semiconductor laser device in which the structure of a rear facet has been improved to obtain a high light output.

Solution to Problem

A first semiconductor laser device disclosed in the present application includes:
  a semiconductor substrate;
  a first conductivity type cladding layer provided on the semiconductor substrate;
  an active layer provided on the first conductivity type cladding layer; and
  a second conductivity type cladding layer provided on the active layer,
  wherein the semiconductor laser device has a front facet and a rear facet that face in opposite directions to each other,
    each of the front facet and the rear facet contains an end portion of the semiconductor substrate, an end portion of the first conductivity type cladding layer, an end portion of the active layer and an end portion of the second conductivity type cladding layer,
    at least one of the front facet and the rear facet includes a resonator facet portion containing the end portion of the active layer, and a protruding portion protruding in a resonator length direction beyond the resonator facet portion by a predetermined protrusion amount and having a stepped bottom surface portion that faces a side of the resonator facet portion,
    the resonator facet portion and the stepped bottom surface portion are connected to each other to form a corner portion,
    a shortest distance from an active layer thickness central axis as a virtual line representing a thickness center position of the active layer to the stepped bottom surface portion is defined as a bottom surface portion depth,
    the bottom surface portion depth is set to be equal to a predetermined specific depth or deeper than the specific depth,
    the specific depth is a shortest distance from the active layer thickness central axis to a position at which guided light guided through the active layer has $1/100$ of a peak intensity value in a light intensity distribution of a vertical transverse mode of the guided light, and
    when the predetermined protrusion amount is represented by X, the bottom surface portion depth is represented by Y, and a half angle of a spread angle of laser light emitted from the resonator facet portion is represented by $\beta$, the predetermined protrusion amount and the bottom surface portion depth are determined so as to satisfy $\beta < \arctan(Y/X)$.

A second semiconductor laser device disclosed in the present application includes:
  a semiconductor substrate;
  a first conductivity type cladding layer provided on the semiconductor substrate;
  an active layer provided on the first conductivity type cladding layer; and
  a second conductivity type cladding layer provided on the active layer,
  wherein the semiconductor laser device has a front facet and a rear facet that face in opposite directions to each other,
    each of the front facet and the rear facet contains an end portion of the semiconductor substrate, an end portion of the first conductivity type cladding layer, an end portion of the active layer and an end portion of the second conductivity type cladding layer, the rear facet includes a resonator facet portion containing the end portion of the active layer, and a protruding portion protruding in a resonator length direction beyond the resonator facet portion by a predetermined protrusion amount and having a stepped bottom surface portion that faces a side of the resonator facet portion, a reflective coating film for reflecting light guided through the active layer at the resonator facet portion is provided on the resonator facet portion, the resonator facet portion and the stepped bottom surface portion are connected to each other to form a corner portion, a shortest distance from an active layer thickness central axis as a virtual line representing a thickness center position of the active layer to the stepped bottom surface portion is defined as a bottom surface portion depth, the bottom surface portion depth is set to be equal to a predetermined specific depth or deeper than the specific depth, and the specific depth is a shortest distance from the active layer thickness central axis to a position at which guided light guided through the active layer has $1/100$ of a peak intensity value in a light intensity distribution of a vertical transverse mode of the guided light.

A third semiconductor laser device disclosed in the present application includes:

a semiconductor substrate;

a first conductivity type cladding layer provided on the semiconductor substrate;

an active layer provided at a first portion on the first conductivity type cladding layer;

an optical waveguide layer that is provided at a second portion adjacent to the first portion on the first conductivity type cladding layer and connected to an end portion of the active layer; and a second conductivity type cladding layer provided on the active layer and the optical waveguide layer, wherein the semiconductor laser device has a front facet and a rear facet that face in opposite directions to each other, the front facet contains an end portion of the semiconductor substrate, an end portion of the first conductivity type cladding layer, an end portion of the active layer and an end portion of the second conductivity type cladding layer, the rear facet contains an end portion of the semiconductor substrate, an end portion of the first conductivity type cladding layer, an end portion of the optical waveguide layer and an end portion of the second conductivity type cladding layer, the rear facet includes an optical waveguide facet portion containing the end portion of the optical waveguide layer, and a protruding portion protruding in a resonator length direction beyond the optical waveguide facet portion by a predetermined protrusion amount and having a stepped bottom surface portion that faces a side of the optical waveguide facet portion, the optical waveguide facet portion and the stepped bottom surface portion are connected to each other to form a corner portion, a shortest distance from an optical waveguide layer thickness central axis as a virtual line representing a thickness center position of the optical waveguide layer to the stepped bottom surface portion is defined as a bottom surface portion depth, the bottom surface portion depth is set to be equal to a predetermined specific depth or deeper than the specific depth, and the specific depth is a shortest distance from the optical waveguide layer thickness central axis to a position at which guided light guided through the optical waveguide layer has $1/100$ of a peak intensity value in a light intensity distribution of a vertical transverse mode of the guided light.

Advantageous Effects of Invention

According to the first semiconductor laser device, the depth of the bottom surface portion is set so that the optical loss caused by scattering of laser light reflected at the resonator facet portion can be suppressed to be sufficiently small. The predetermined protrusion amount is appropriately determined in accordance with the set depth of the bottom surface portion so that the laser light emitted from the resonator facet portion is not significantly hindered by the protruding portion. As a result, both a high light output and an excellent far-field pattern can be surely achieved.

According to the second semiconductor laser device, the depth of the bottom surface portion is set so that the optical loss caused by scattering of laser light reflected at the resonator facet portion provided on the rear facet can be suppressed to be sufficiently small. Furthermore, regarding the rear facet whose reflectivity is increased by providing the reflective coating film, it is not necessary to consider the spread of the laser radiation with respect to the protruding portion. As a result, a high light output can be ensured by appropriately setting the depth of the bottom surface portion.

According to the third semiconductor laser device, in an external resonator type semiconductor laser device having a semiconductor laser portion and an optical waveguide portion, the depth of the bottom surface portion is set so that an optical loss caused by scattering of laser light reflected at the optical waveguide facet portion provided on the rear facet can be suppressed to be sufficiently small. As a result, a high light output can be ensured by appropriately setting the depth of the bottom surface portion.

DESCRIPTION OF EMBODIMENTS

First Embodiment

Figure 1:
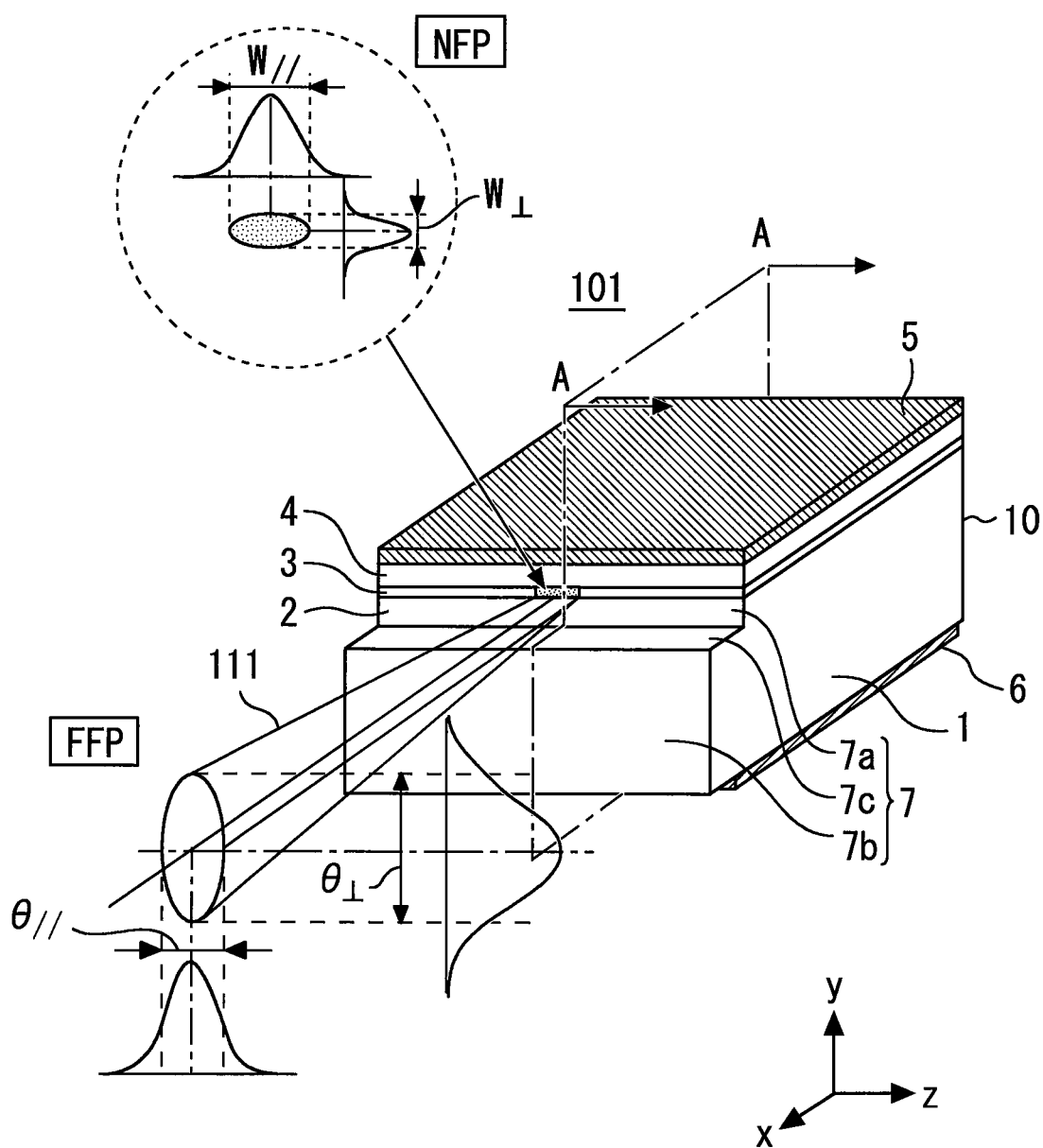
FIG. 1 is a perspective view showing the configuration of a semiconductor laser device according to a first embodiment.
Figure 2:
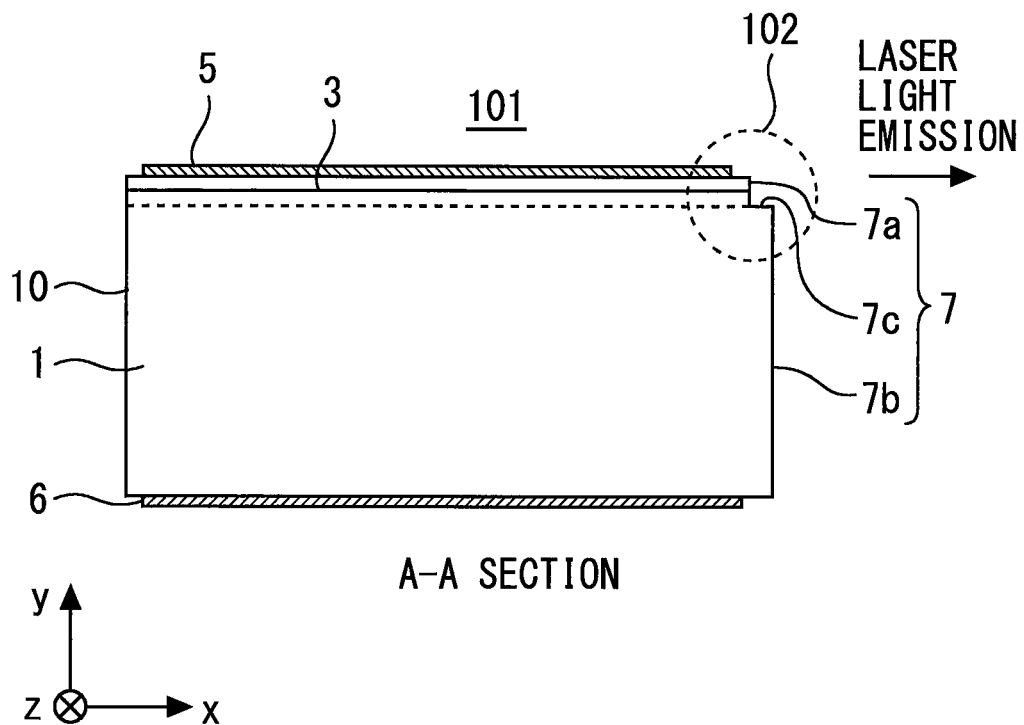
FIG. 2 is a cross-sectional view showing the configuration of the semiconductor laser device according to the first embodiment.
Figure 3:
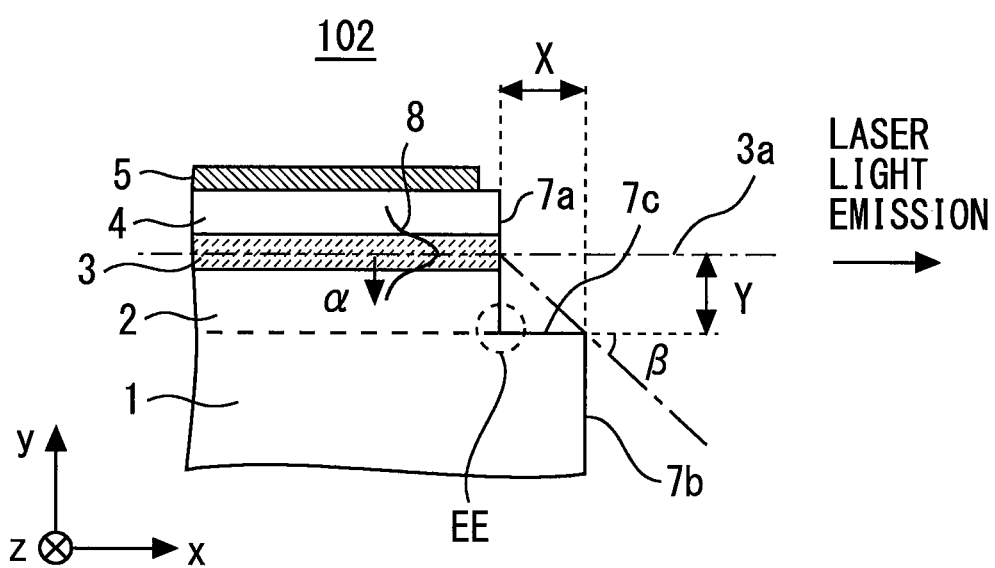
FIG. 3 is a partially enlarged view showing the configuration of the semiconductor laser device according to the first embodiment.

FIG. 1 is a perspective view showing the configuration of a semiconductor laser device 101 according to a first embodiment. FIG. 2 is a cross-sectional view showing the configuration of the semiconductor laser device 101 according to the first embodiment. FIG. 2 is a cross-sectional view of the semiconductor laser device 101 taken along an A-A virtual plane of FIG. 1. FIG. 3 is a partially enlarged view showing the configuration of the semiconductor laser device 101 according to the first embodiment. FIG. 3 is an enlarged view of a vicinity 102 of a resonator facet portion in FIG. 2.

The semiconductor laser device 101 according to the first embodiment is an end face light emission type semiconductor laser device. As shown in FIG. 3, the semiconductor laser device 101 includes a semiconductor substrate 1, a first conductivity type cladding layer 2 provided on the semiconductor substrate 1, an active layer 3 provided on the first conductivity type cladding layer 2, and a second conductivity type cladding layer 4 provided on the active layer 3. In the first embodiment, the first conductivity type is n-type, and the second conductivity type is p-type. However, as a modification, the n-type and the p-type may be reversed.

An example of the thickness of each layer is shown. The thickness of the semiconductor substrate 1 made of InP may be set to 100 μm. The thickness of the first conductivity type cladding layer 2 made of InP may be set in the range of 2 μm to 3 μm. The thickness of the active layer 3 may be set to 0.2 μm. The thickness of the second conductivity type cladding layer 4 made of InP may be set in the range of 2 μm to 3 μm. The thickness of a first ohmic electrode 5 may be set in the range of 2 μm to 3 μm. The thickness of a second ohmic electrode 6 may be set in the range of 2 μm to 3 μm.

As shown in FIG. 3, in a cross-sectional view obtained by cutting the semiconductor laser device 101 along the A-A virtual plane, a virtual line indicating a position where the thickness of the active layer 3 is halved is referred to as "active layer thickness central axis 3a". In the first embodiment, for convenience, a broken line indicating the active layer thickness central axis 3a in FIG. 3 is set as a virtual line extending not only inside the active layer 3, but also outside the active layer 3.

A light emission shape on a resonator facet portion 7a is called a near-field pattern. Hereinafter, the near-field pattern is also simply referred to as an "NFP". The NFP is determined by a waveguide state of light inside the semiconductor laser device 101. The NFP is represented by a horizontal transverse mode $W_{//}$ and a vertical transverse mode $W_\perp$. A first parameter α noted in the present application in relation to the NFP is defined as $\alpha = W_\perp/2$.

The first conductivity type cladding layer 2 and the second conductivity type cladding layer 4 sandwich the active layer 3 therebetween. When the refractive index difference between the active layer 3 and each of the first conductivity type cladding layer 2 and the second conductivity type cladding layer 4 is large, a larger amount of light is confined in the active layer 3. In other words, the active layer 3 plays a role of oscillating laser light, and also plays a role of guiding light while confining light by being sandwiched between the two cladding layers. When the confinement of light in the active layer 3 becomes stronger, the light distribution of the NFP becomes smaller. On the contrary, when the refractive index difference is small, it becomes difficult to confine light in the active layer 3, so that the light distribution of the NFP becomes large.

Laser radiation 111 emitted from the semiconductor laser device 101 spreads in the space due to a diffraction phenomenon. The spreading shape of light at this time is called a far-field pattern. Hereinafter, the far-field pattern is also simply referred to as "FFP". The FFP is represented by a radiation angle $\theta_\perp$ in a direction perpendicular to the active layer 3 and a radiation angle $\theta_{//}$ in a direction parallel to the active layer 3. A second parameter β noted in the first embodiment is defined as $\beta = \theta_\perp/2$. β represents a half angle of the radiation angle $\theta_\perp$ in the laser radiation 111. A diffraction phenomenon when the laser radiation spreads in the space is mathematically expressed by the relationship of Fourier transform. The relationship between the first parameter α and the second parameter β is connected to each other by Fourier transform relationship. β decreases when α increases, whereas β increases when α decreases.

The semiconductor laser device 101 includes a front facet 7 and a rear facet 10 that face in opposite directions to each other. Each of the front facet 7 and the rear facet 10 includes end portions of the semiconductor substrate 1, the first conductivity type cladding layer 2, the active layer 3, and the second conductivity type cladding layer 4. In the first embodiment, the front facet 7 includes a resonator facet portion 7a, a protruding portion 7b, and a stepped bottom surface portion 7c.

In FIGS. 1 to 3, xyz axes which are orthogonal to one other are indicated for convenience of description. The y-axis is a crystal growth direction when crystal forming the semiconductor layer is grown on the surface of the semiconductor substrate 1. The y-axis is a thickness direction of each semiconductor layer, and is also a thickness or height direction of the semiconductor laser device 101. The x-axis is a direction in which the laser radiation 111 travels. The x-axis is also a direction axis for representing "resonator length". The resonator length is an interval between a pair of resonator faces equipped to the semiconductor laser device 101. The resonator length in the first embodiment is the distance between the resonator facet portion 7a of the front facet 7 and the rear facet 10. The z-axis is orthogonal to the x-axis and the y-axis. The z-axis is a width direction of the semiconductor laser device 101. The A-A virtual plane in FIG. 1 is parallel to an xy plane in the xyz coordinate system shown in FIGS. 1 to 3.

The semiconductor laser device 101 may be manufactured by metal organic chemical vapor deposition epitaxial (MOVPE). The first conductivity type cladding layer 2 made of InP, the active layer 3, and the second conductivity type cladding layer 4 made of InP may be laminated on the semiconductor substrate 1 made of InP by using MOVPE. After the lamination of the semiconductor layers, etching is performed halfway through the first conductivity type cladding layer 2 or halfway through the semiconductor substrate 1 by dry etching. The resonator facet portion 7a is formed at a site which has been cut by dry etching, and a protruding portion 7b is formed at a site which has not been cut by dry etching. The dry etching may be reactive ion etching using, for example, methane gas or chlorine gas. An electrode for power feeding is formed after or before the dry etching. A first ohmic electrode 5 for power feeding is formed on the second conductivity type cladding layer 4. A second ohmic electrode 6 for power feeding is formed on the back surface of the semiconductor substrate 1 made of InP.

As shown in FIG. 3, the resonator facet portion 7a includes the respective end portions of the first conductivity type cladding layer 2, the active layer 3, and the second conductivity type cladding layer 4. The protruding portion 7b protrudes in the resonator length direction, that is, in the x-axis direction beyond the resonator facet portion 7a. The dimension of the protrusion of the protruding portion 7b is referred to as a predetermined protrusion amount X. The protruding portion 7b includes a stepped bottom surface portion 7c facing the resonator facet portion 7a side. The resonator facet portion 7a and the stepped bottom surface portion 7c are connected to each other to thereby forming an etching edge corner portion EE. The distance from the center position of the thickness of the active layer 3 to the stepped bottom surface portion 7c is defined as a bottom surface portion depth Y. The bottom surface portion depth Y is determined by the depth of dry etching when the resonator facet portion 7a is formed. The bottom surface portion depth Y indicates the shortest distance from the active layer thickness central axis 3a of the active layer 3 to the stepped bottom surface portion 7c along the y-axis direction.

FIG. 3 also shows guided light 8. The guided light 8 schematically represents the distribution of light being guided through the active layer 3. The first parameter $\alpha = W_1/2$ noted in the first embodiment is determined by the distribution shape of the guided light 8. The guided light 8 is generated when the refractive index of the active layer 3 is higher than the refractive indexes of the first conductivity type cladding layer 2 and the second conductivity type cladding layer 4 around the active layer 3. As the refractive index of the active layer 3 is increased, the confinement of light inside the active layer 3 is also increased. When the confinement of light inside the active layer 3 becomes stronger, a component exuding to the outside of the active layer 3 becomes smaller, so that α becomes smaller. On the other hand, when the refractive index of the active layer 3 is smaller, the confinement of light in the active layer 3 is smaller, so that α is larger.

The predetermined protrusion amount X and the bottom surface portion depth Y are set as follows. The second parameter β noted in the first embodiment is a half angle of a spread angle of the laser radiation 111 emitted from the resonator facet portion 7a. The predetermined protrusion amount X and bottom surface portion depth Y are determined so as to satisfy β<arctan(Y/X) which is a condition using an inverse trigonometric function. As a result, the laser radiation 111 output from the resonator facet portion 7a can be suppressed from being blocked by the protruding portion 7b, so that an excellent FFP can be obtained.

Figure 4:
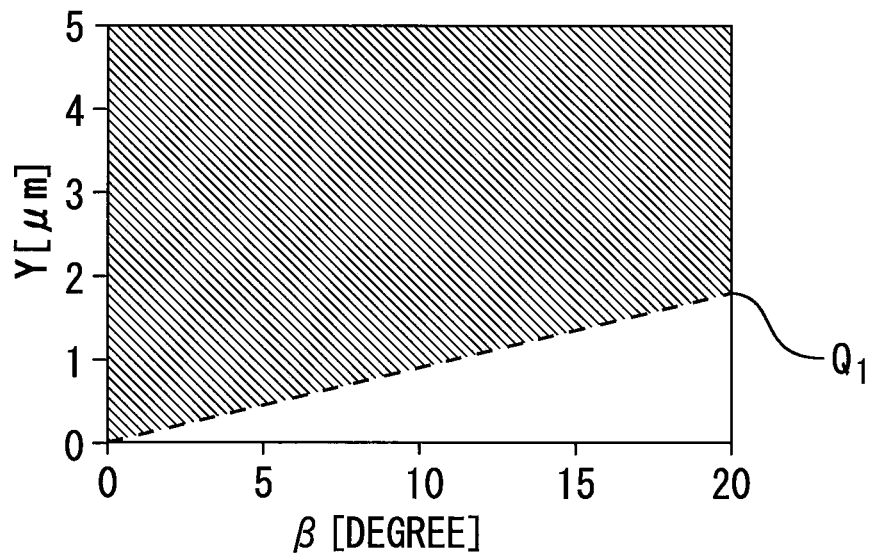
FIG. 4 is a graph showing the bottom surface portion depth of the semiconductor laser device according to the first embodiment.

FIGS. 4 to 10 are graphs showing the bottom surface portion depth Y of the semiconductor laser device 101 according to the first embodiment. FIG. 4 is a graph in which β is set on the horizontal axis and the bottom surface portion depth Y is set on the vertical axis. The bottom surface portion depth Y is determined by taking a preferable predetermined protrusion amount X=5 μm as an example. A broken line Q1 is a condition for preventing the traveling path of the laser radiation 111 output from the resonator facet portion 7a from being hindered by the protruding portion 7b. It is preferable to make the bottom surface portion depth Y deeper than the broken line Q1 according to various β.

Here, the relationship between the guided light 8 and the predetermined depth Y will be described. The refractive index of the first conductivity type cladding layer 2 is represented by $n_{c1}$. The refractive index of the second conductivity type cladding layer 4 is represented by $n_{c2}$. In the active layer 3, the number of layers is represented by m, the refractive index of a j-th layer is represented by $n_j$, and the layer thickness of the j-th layer is represented by $d_j$. The active layer 3 is a structure sandwiched between the first conductivity type cladding layer 2 and the second conductivity type cladding layer 4. The y direction is a lamination direction of the first conductivity type cladding layer 2, the active layer 3, and the second conductivity type cladding layer 4. An optical electric field distribution of guided light in the lamination direction y is represented by E.

An optical electric field $E_{c1}(y)$ of the first conductivity type cladding layer 2 can be expressed by the following mathematical expressions (1) and (2). Here, n represents the transmission refractive index, and $k_0$ represents the wave number in vacuum. $D_1$ represents a predetermined coefficient.

[Math. 1]

$$E_{c1}(y) = D_1 \exp(\gamma_{c1} y) \quad (1)$$

[Math. 2]

$$\gamma_{c1} = k_0 \sqrt{(n^2 - n_{c1}^2)} \quad (2)$$

An optical electric field $E_j(y)$ of each layer of the active layer 3 can be expressed by the following mathematical expressions (3) and (4). $A_j$ and $B_j$ represent predetermined coefficients.

[Math. 3]

$$E_j(y) = A_j \cos(\gamma_j(y - \Sigma_{j=1}^{j-1} d_j)) + B_j \sin(\gamma_j(y - \Sigma_{j=1}^{j-1} d_j)) \quad (3)$$

[Math. 4]

$$\gamma_j = k_0(n_j^2 - n^2) \quad (4)$$

An optical electric field $E_{c2}(y)$ of the second conductivity type cladding layer 4 can be expressed by the following mathematical expressions (5) and (6). Here, n represents the transmission refractive index, and $k_0$ represents the wave number in vacuum. $D_2$ represents a predetermined coefficient.

[Math. 5]

$$E_{c2}(y) = D_2 \exp(\gamma_{c2} y) \quad (5)$$

[Math. 6]

$$\gamma_{c2} = k_0 \sqrt{(n^2 - n_{c2}^2)} \quad (6)$$

Here, the square of the electric field intensity E, that is, the distribution of the light intensity $E^2$ will be reviewed. The distribution shape of the light intensity $E^2$ spreads so that it has a peak intensity on the active layer thickness central axis 3a of the active layer 3 and also has a skirt on both sides of the active layer thickness central axis 3a. The light intensity $E^2$ has a mountain-shaped distribution so that the peak intensity is a top portion and the light intensity gradually decreases from the peak intensity at the top portion. A point at which the light intensity $E^2$ has reached $1/100$ of the peak intensity thereof has come in the middle of the decrease of the light intensity from the peak intensity to the foot. Since the mountain-shaped distribution of the light intensity $E^2$ has two feet on both sides of the peak, each of the two feet has a point at which the light intensity $E^2$ is equal to $1/100$ of the peak intensity thereof. On the foot which is closer to the semiconductor substrate 1 out of the two feet, the shortest distance along the y-axis direction between the point where the light intensity $E^2$ is equal to "$1/100$ of the peak intensity thereof" and the active layer thickness central axis 3a is described as "specific depth $y_{1/100}$" for convenience.

Figure 5:
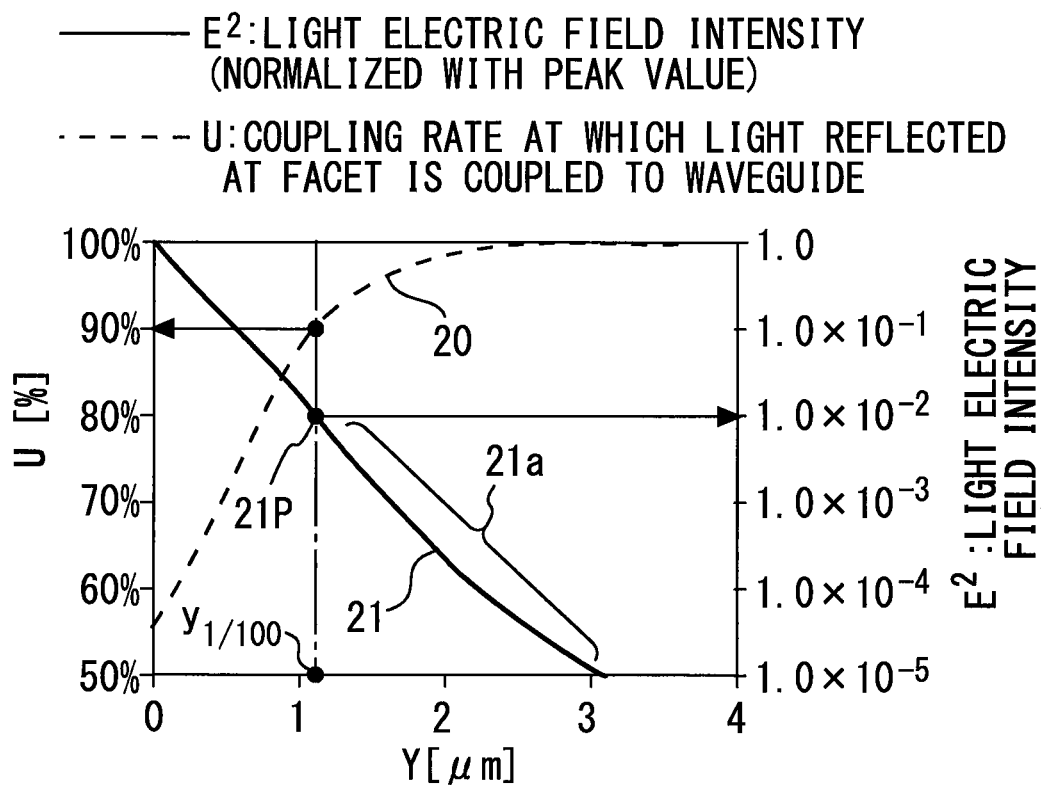
FIG. 5 is a graph showing the bottom surface portion depth of the semiconductor laser device according to the first embodiment.

A graph of FIG. 5 shows what relationship a rate at which reflected light at the resonator facet portion 7a is coupled to a waveguide and the light intensity have according to the bottom surface portion depth Y. A broken line 20 in FIG. 5 represents a rate U at which light reflected at the resonator facet portion 7a is coupled to the active layer 3 again. The broken line 20 is a characteristic graph showing how the coupling rate U changes according to the bottom surface portion depth Y. A solid line 21 in FIG. 5 is a characteristic graph showing the relationship between a value obtained by normalizing the light intensity $E^2$ with the peak value and the bottom surface portion depth Y. The graph of FIG. 5 is obtained by performing calculation for an example of the semiconductor laser device 101 according to the first embodiment. Under a calculation condition of FIG. 5, the layer thickness and refractive index of the active layer 3 are set to 0.24 μm and 3.35, respectively. Under the calculation condition of FIG. 5, the refractive indexes of the first conductivity type cladding layer 2 and the second conductivity type cladding layer 4 are set to $n_{c1} = n_{c2} = 3.216$.

A point 21p exists on a solid-line graph of FIG. 5. This point 21p is a point at which the light intensity is equal to $1/100$ of the peak intensity value. The dimension of the bottom surface portion depth Y corresponding to this point 21p is the specific depth $y_{1/100}$. In the first embodiment, the bottom surface portion depth Y is set to equal to or larger than the specific depth $y_{1/100}$. A specific structure will be described later while referring to FIG. 11.

Figure 6:
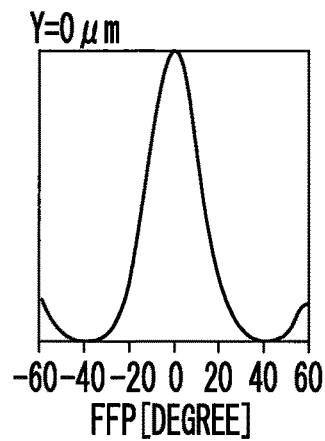
FIG. 6 is a graph showing the bottom surface portion depth of the semiconductor laser device according to the first embodiment.
Figure 7:
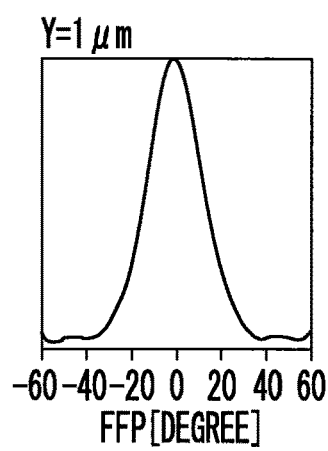
FIG. 7 is a graph showing the bottom surface portion depth of the semiconductor laser device according to the first embodiment.
Figure 8:
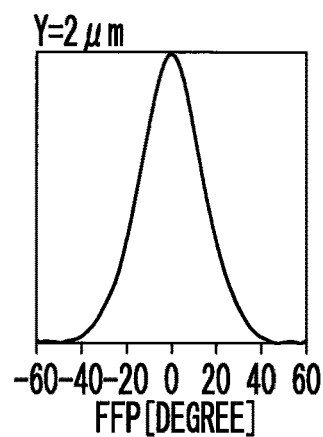
FIG. 8 is a graph showing the bottom surface portion depth of the semiconductor laser device according to the first embodiment.

FIGS. 6 to 8 show far-field patterns at Y=0 μm, 1 μm, and 2 μm with the radiation angle of light emitted from the resonator facet portion 7a set on the horizontal axis. Regarding the data of Y=0 μm shown in FIG. 6, satellite peaks occur in the vicinity of plus 60 degrees and in the vicinity of minus 60 degrees. The satellite peak is a non-coupled component that occurs when the laser radiation 111 is coupled to an optical fiber for optical communication. A radiation shape such as the radiation shape of Y=0 μm is not preferable because optical input power to the fiber is reduced. At Y=1 μm shown in FIG. 7, there is no satellite peak, so that the input power to the optical fiber is also improved. In the case of Y=1 μm, as can be read from FIG. 5, 90% of reflected light at the end face can be coupled to the active layer 3 again, so that there is no significant deterioration in characteristics. It is an unacceptably large loss for devices used in the optical communication field that the rate at which the reflected light at the end face is coupled to the active layer 3 again is less than 90%. Therefore, it is preferable that the light intensity $E^2$ is not affected by light scattering up to "$1/100$ of the peak intensity".

Note that the relationship between the reflected light coupling rate and the light intensity does not depend on the layer thickness and refractive index of the active layer 3. Therefore, the relationship shown in FIG. 5 is established regardless of the structure of the active layer 3. In other words, at the specific depth $y_{1/100}$, the rate at which the reflected light is coupled to the active layer 3 is equal to 90%.

Figure 9:
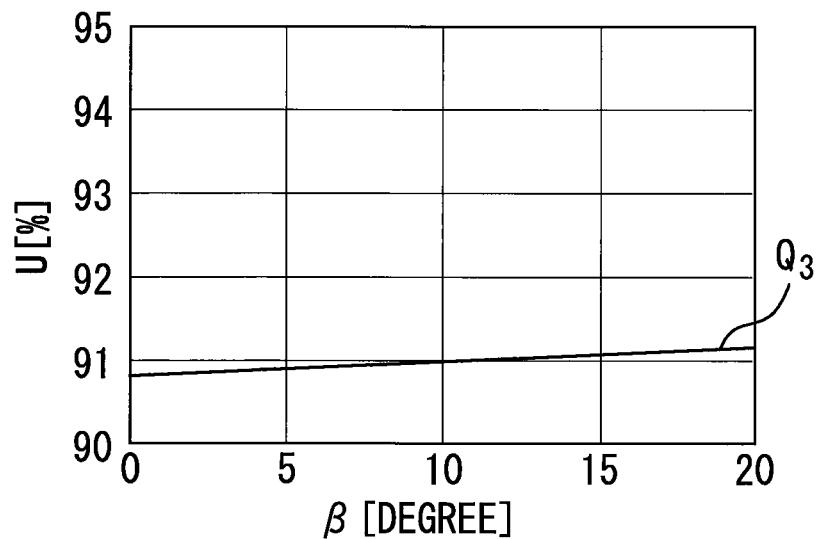
FIG. 9 is a graph showing the bottom surface portion depth of the semiconductor laser device according to the first embodiment.

The above technical description given with reference to FIG. 5 has been made on the assumption that the refractive index of the active layer 3 is 3.35 and attention is paid to the specific depth $y_{1/100}$. It will be described with reference to FIG. 9 that the above technical description is generalized or extended for other refractive indexes and the like. The horizontal axis of a graph of FIG. 9 is the second parameter β determined by the radiation angle. In FIG. 9, the second parameter β is calculated while changing the refractive index of the active layer 3. The vertical axis of the graph of FIG. 9 represents the rate at which the reflected light is coupled to the active layer 3. As shown in FIG. 9, even if the active layer 3 has a structure that gives any radiation angle, the rate at which the reflected light is coupled to the active layer 3 is approximately 90%. The influence on β is similar even when the thickness of the active layer 3 is changed or when the refractive indexes of the first conductivity type cladding layer 2 and the second conductivity type cladding layer 4 are changed. Therefore, it may be practically regarded that the relationship of FIG. 9 is established regardless of the thickness of the active layer 3 and the difference in refractive index.

For the above reasons, the bottom surface portion depth Y can be ensured up to at least the specific depth $y_{1/100}$ by performing dry etching from the active layer thickness central axis 3a of the active layer 3 to at least the specific depth $y_{1/100}$. According to such a configuration, it is possible to suppress the guided light 8 from being influenced by light scattering at the etching edge corner portion EE.

Note that in the first embodiment, the range from the peak intensity to $1/100$ of the peak intensity is set for the following reason. At the moment, needs or applications are hardly considered for semiconductor laser device having a characteristic that the coupling rate at the resonator facet portion 7a is 70%, that is, a semiconductor laser device having a characteristic that a mirror loss is about 30%. Further, considering general manufacturing tolerances, etc., of semiconductor laser devices each having a cleaved end face, the mirror loss is expected to have a variation of about 10%. Therefore, it can be concluded that the characteristic that the coupling rate is 90%, that is, the characteristic that the optical loss is suppressed to 10% is a reasonable allowable loss. However, the bottom surface portion depth Y may be set to be deeper according to an application of the semiconductor laser device 101. For example, the shortest distance along the y-axis direction from the active layer thickness central axis 3a of the y active layer 3 to a point where the peak intensity is equal to $1/1000$ is defined as a specific depth $y_{1/1000}$. Instead of the specific depth $y_{1/100}$, the bottom surface portion depth Y may be set to be equal to or deeper than the other specific depth $y_{1/1000}$.

Figure 10:
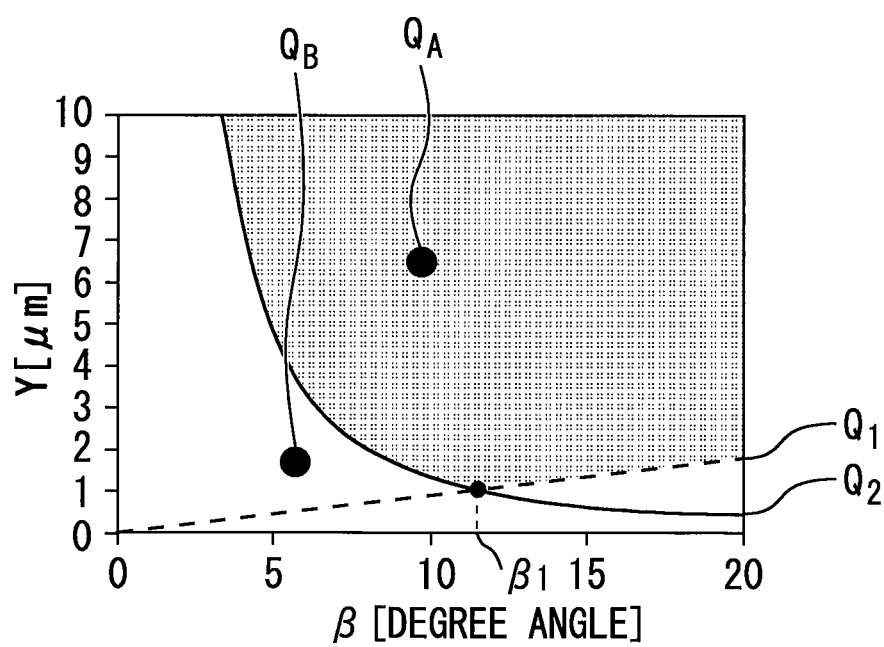
FIG. 10 is a graph showing the bottom surface portion depth of the semiconductor laser device according to the first embodiment.

FIG. 10 is a diagram showing the range of an effect of the first embodiment. The bottom surface portion depth Y is set in a range Qx that is on or above a broken line Q1 and on or above a solid line Q2. The solid line Q2 is a condition determined based on the mathematical expressions (1) to (6), and is a condition for setting the bottom surface portion depth Y to be deeper than the specific depth $y_{1/100}$. The refractive indexes of the first conductivity type cladding layer 2 and the second conductivity type cladding layer 4 are set to $n_{c1}=n_{c2}=3.216$. Note that in FIG. 10, the active layer 3 is treated as a single layer film having a thickness of 0.24 μm. The value of β is changed while changing the refractive index $n_j$ of the active layer 3. By setting the light intensity at y=0 to $E^2=1$, the simultaneous equations of the mathematical expressions (1) to (6) can be solved. By making the bottom surface portion depth Y fall into the range Qx, the guided light 8 is not scattered by the etching edge corner portion EE. As a result, the semiconductor laser device 101 having excellent characteristics can be obtained.

Figure 11:
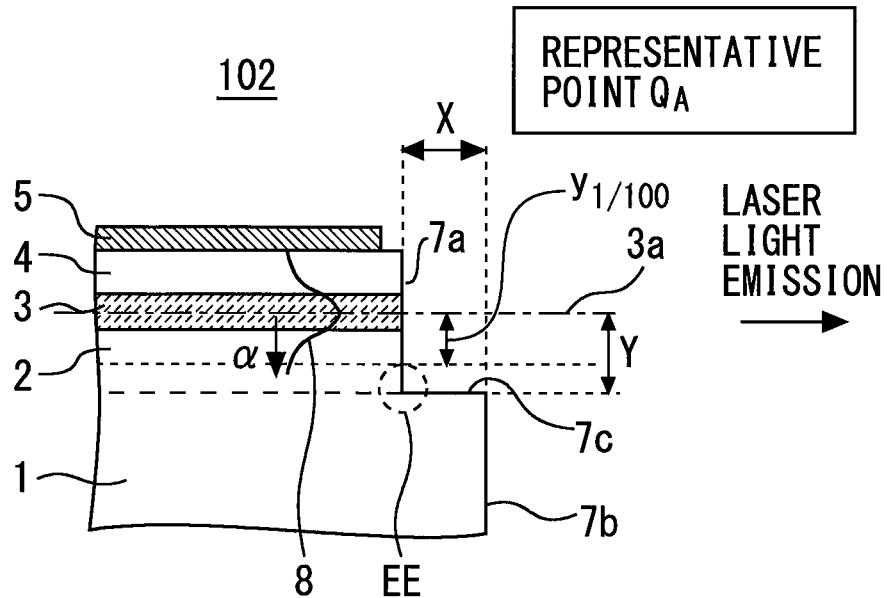
FIG. 11 is a partially enlarged view showing the bottom surface portion depth of the semiconductor laser device according to the first embodiment.

FIG. 11 is a partially enlarged view showing the bottom surface portion depth Y of the semiconductor laser device 101 according to the first embodiment. FIG. 11 shows a representative example of the first embodiment, and shows a cross-sectional shape having a bottom surface portion depth Y corresponding to a point $Q_A$ in FIG. 10. In FIG. 11, the bottom surface portion depth Y is set to be larger than the specific depth $y_{1/100}$, that is, to be deeper. By setting as described above, the guided light 8 is not applied to the etching edge corner portion EE. It is required that the bottom surface portion depth Y is not smaller than the specific depth $y_{1/100}$, and thus it may be set to be equal to the specific depth $y_{1/100}$.

Figure 12:
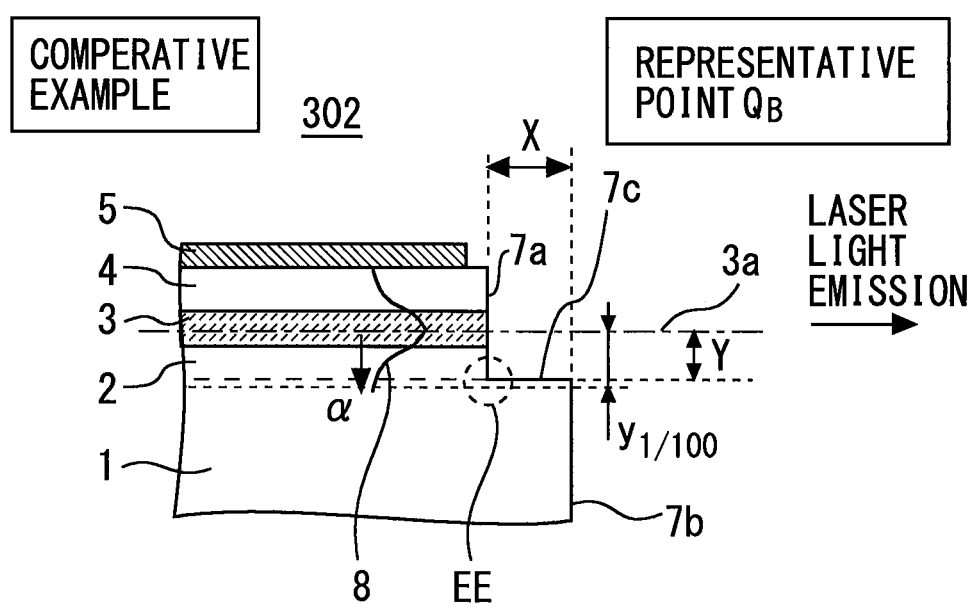
FIG. 12 is a partially enlarged view of a comparative example shown to explain the bottom surface portion depth of the semiconductor laser device according to the first embodiment.

On the other hand, FIG. 12 is a partially enlarged view of a comparative example shown to explain the bottom surface portion depth Y of the semiconductor laser device 101 according to the first embodiment. FIG. 12 shows a representative example of the comparative example, and shows a cross-sectional shape having a bottom surface portion depth Y corresponding to a point $Q_B$ in FIG. 10. In FIG. 12, the bottom surface portion depth Y is set to be smaller than the specific depth $y_{1/100}$, that is, to be shallower. In FIG. 12, it can be seen that a part of the light distribution guided through the active layer 3 is applied to the etching edge corner portion EE. By adopting the structure of FIG. 11 instead of the structure of FIG. 12, it is possible to suppress deterioration of the characteristics of the semiconductor laser device 101. Note that since a practical value of β is in the range of 5 degrees to 20 degrees, a semiconductor laser having excellent characteristics can be stably obtained by adjusting the bottom surface portion depth Y according to the range Qx shown in FIG. 10.

As described above, according to the first embodiment, by considering the intensity distribution of the laser radiation 111 guided inside the resonator, that is, the NFP, the bottom surface portion depth Y is set so that the optical loss caused by scattering of the laser radiation 111 reflected at the resonator facet portion 7a can be suppressed to be sufficiently small. As a result, a high light output can be obtained. In addition, the predetermined protrusion amount X is appropriately set in association with the bottom surface portion depth Y set appropriately as described above so that the laser radiation 111 emitted from the resonator facet portion 7a is not greatly hindered by the protruding portion 7b. As a result, it is possible to surely achieve both the high light output and the excellent FFP.

Figure 16:
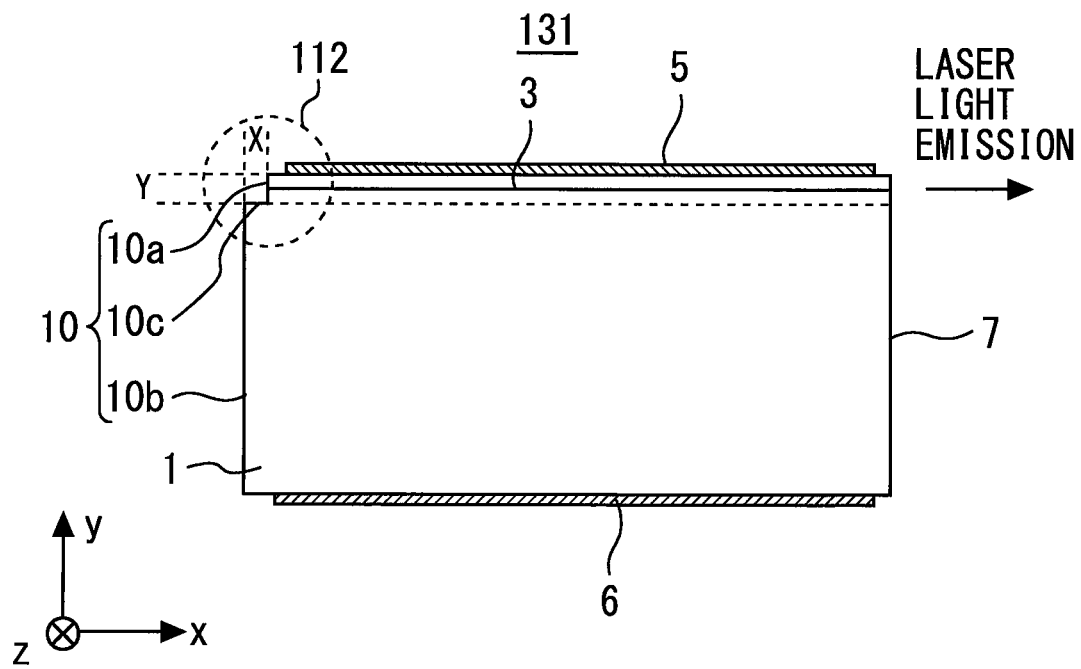
FIG. 16 is a diagram showing a configuration of a semiconductor laser device according to a modification of the first embodiment.
Figure 17:
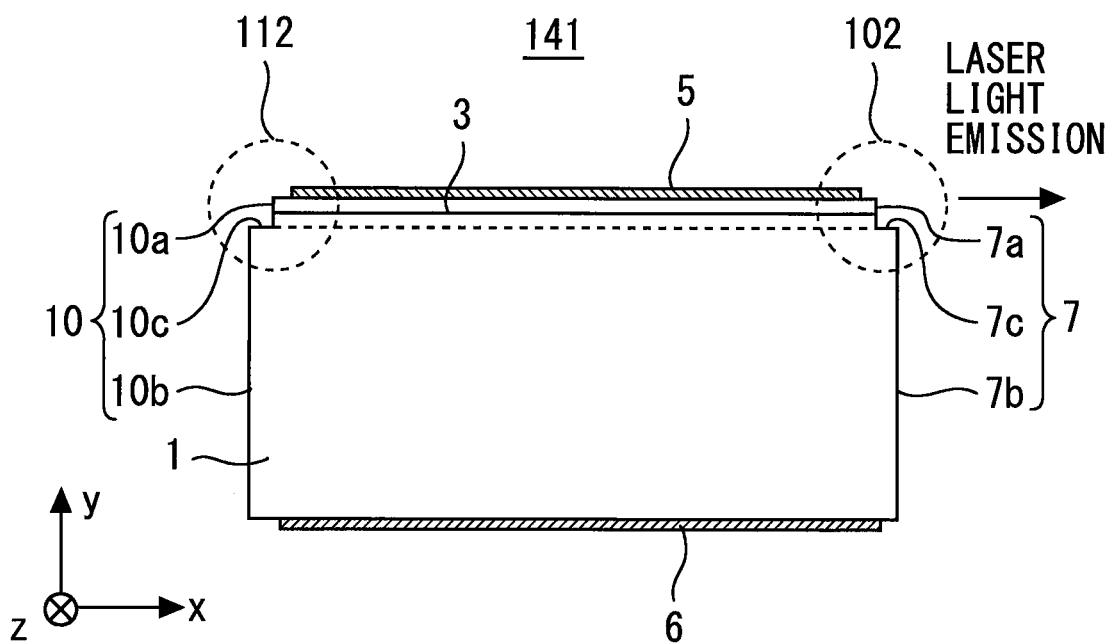
FIG. 17 is a diagram showing a configuration of a semiconductor laser device according to a modification of the first embodiment.

FIG. 16 is a diagram showing a configuration of a semiconductor laser device 131 according to a modification of the first embodiment. The rear facet 10 may be provided with a resonator facet portion 10a, a protruding portion 10b, and a stepped bottom surface portion 10c. FIG. 17 is a diagram showing a configuration of a semiconductor laser device 141 according to a modification of the first embodiment. Both the front facet 7 and the rear facet 10 may be provided with resonator facet portions 7a and 10a, protruding portions 7b and 10b, and stepped bottom surface portions 7c and 10c. In the modifications of FIGS. 16 and 17, the predetermined protrusion amount X and the bottom surface portion depth Y may be set based on the same reference as the first embodiment described above.

Second Embodiment

Figure 13:
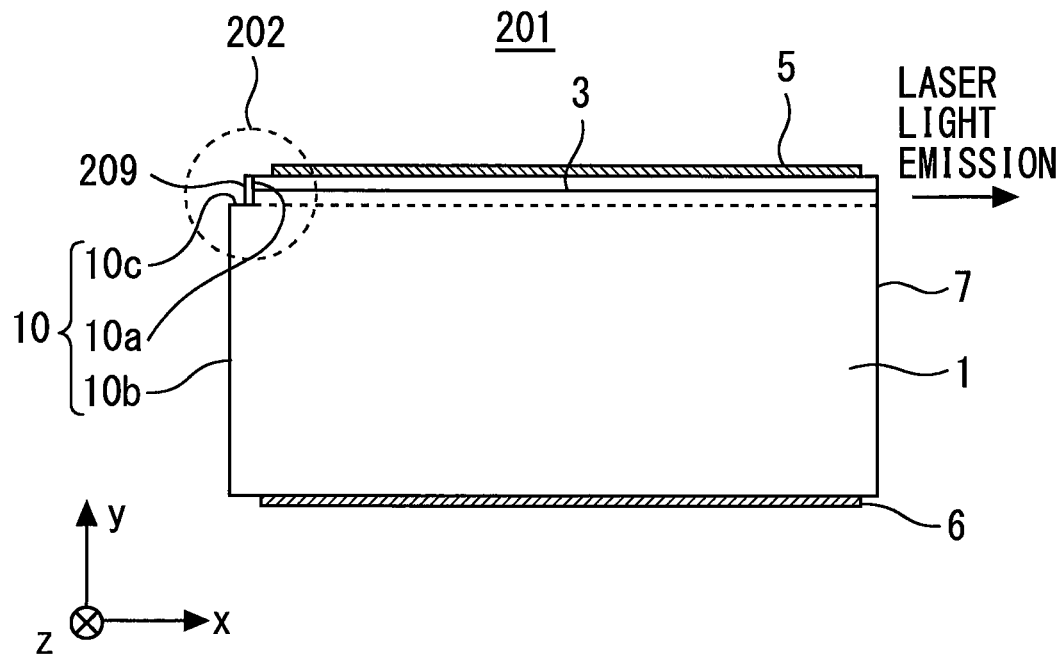
FIG. 13 is a cross-sectional view showing a configuration of a semiconductor laser device according to a second embodiment.
Figure 14:
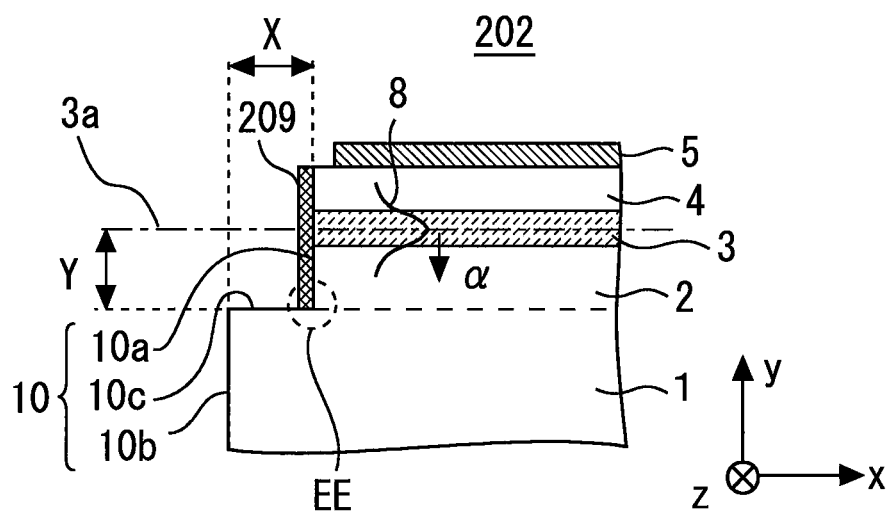
FIG. 14 is a partially enlarged view showing the configuration of the semiconductor laser device according to the second embodiment.

FIG. 13 is a cross-sectional view showing a configuration of a semiconductor laser device 201 according to a second embodiment. FIG. 14 is a partially enlarged view showing the configuration of the semiconductor laser device 201 according to the second embodiment. The semiconductor laser device 201 according to the second embodiment is different from the semiconductor laser device 201 according to the first embodiment in the following points. First, unlike the first embodiment, the rear facet 10 includes a resonator facet portion 10a and a protruding portion 10b. Further, unlike the first embodiment, a reflective coating film 209 is provided on the resonator facet portion 10a.

By applying the reflective coating film 209, the guided light 8 guided through the active layer 3 can be reflected at the resonator facet portion 10a, and output light from the resonator facet portion 10a can be reduced. If the reflectance of the reflective coating film 209 for a laser oscillation wavelength X of the semiconductor laser device 201 is made sufficiently high, the output light from the resonator facet portion 10a can also be made substantially zero. The reflective coating film 209 is configured by a dielectric film or the like.

Figure 15:
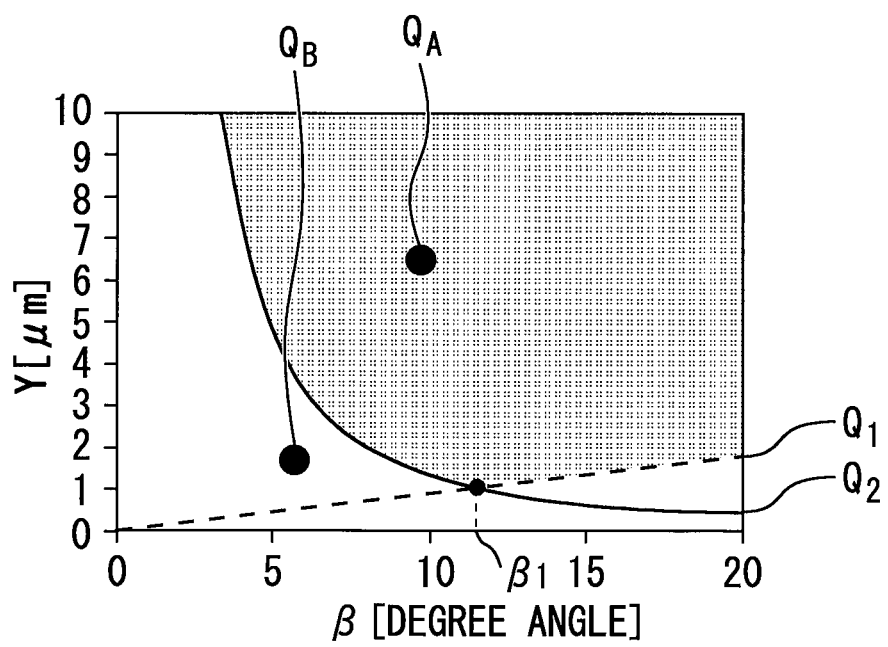
FIG. 15 is a graph showing the bottom surface portion depth of the semiconductor laser device according to the second embodiment.

FIG. 15 is a graph showing the bottom surface portion depth Y of the semiconductor laser device 201 according to the second embodiment. FIG. 15 can be used to determine the bottom surface portion depth Y like FIG. 10 in the first embodiment. A range $Q_{xx}$ of the bottom surface portion depth Y in the second embodiment is a hatched portion in FIG. 15. In addition to the range $Q_{x1}$ corresponding to the first embodiment, the bottom surface portion depth Y can also be set in a range $Q_{x2}$. The range $Q_{x2}$ is a range which is not below a solid line Q2 and is not above a broken line Q1. By providing the reflective coating film 209 so as to prevent the laser radiation 111 from being emitted to the outside the semiconductor laser device 201, it is unnecessary to take the second parameter β into consideration. Since it is unnecessary to take the second parameter β into consideration, the broken line Q1 in FIG. 15 can be ignored. As a result, since it is sufficient only to take the first parameter α into consideration, the bottom surface portion depth Y may be determined in consideration of only the solid line Q in FIG. 15, that is, the bottom surface portion depth Y may be determined according to FIG. 5 of the first embodiment. As a result, as in the case of the first embodiment, scattering of the guided light 8 at the etching edge corner portion EE can be suppressed, and the loss can be suppressed.

In the second embodiment, the front facet 7 includes neither the resonator facet portion 7a nor the protruding portion 7b. However, as a modification, the resonator facet portion 7a and the protruding portion 7b may be further added to the front facet 7 in the semiconductor laser device 201.

Third Embodiment

Figure 18:
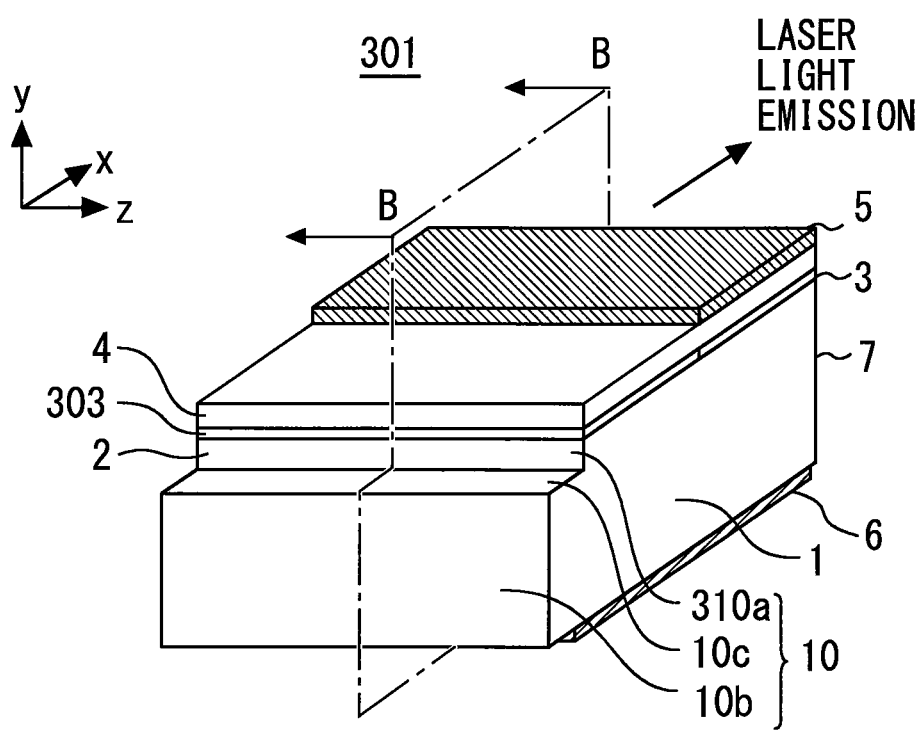
FIG. 18 is a perspective view showing a configuration of an external resonator type semiconductor laser device according to a third embodiment.
Figure 19:
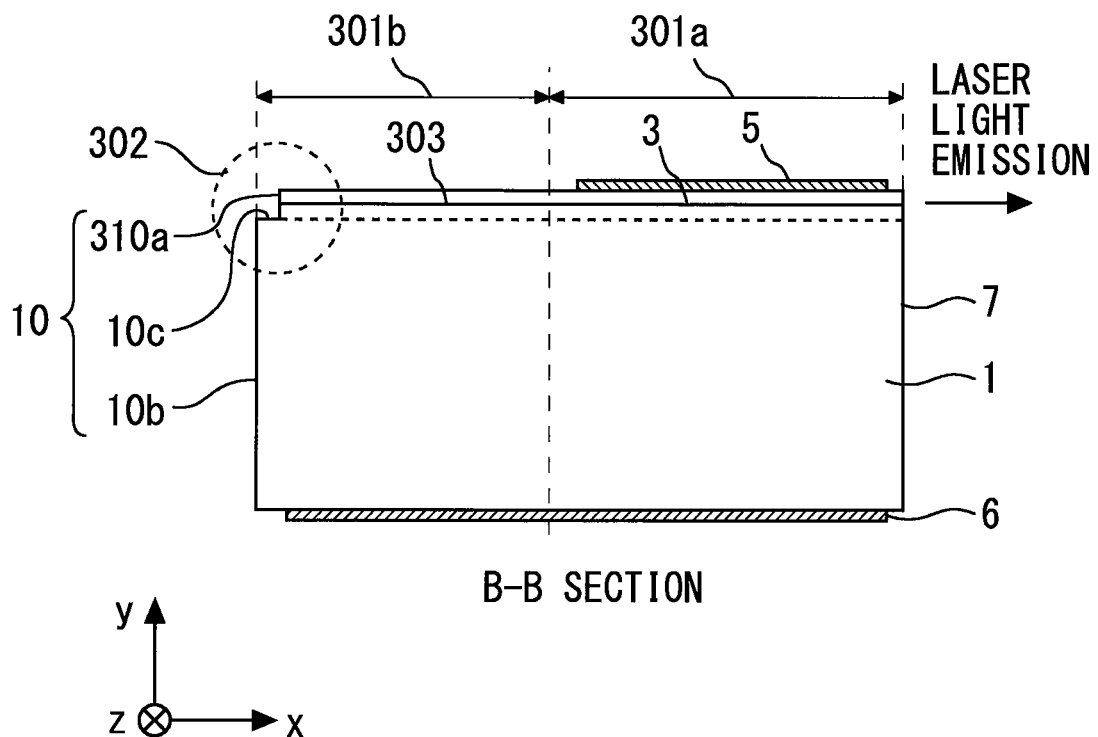
FIG. 19 is a cross-sectional view showing the configuration of the external resonator type semiconductor laser device according to the third embodiment.
Figure 20:
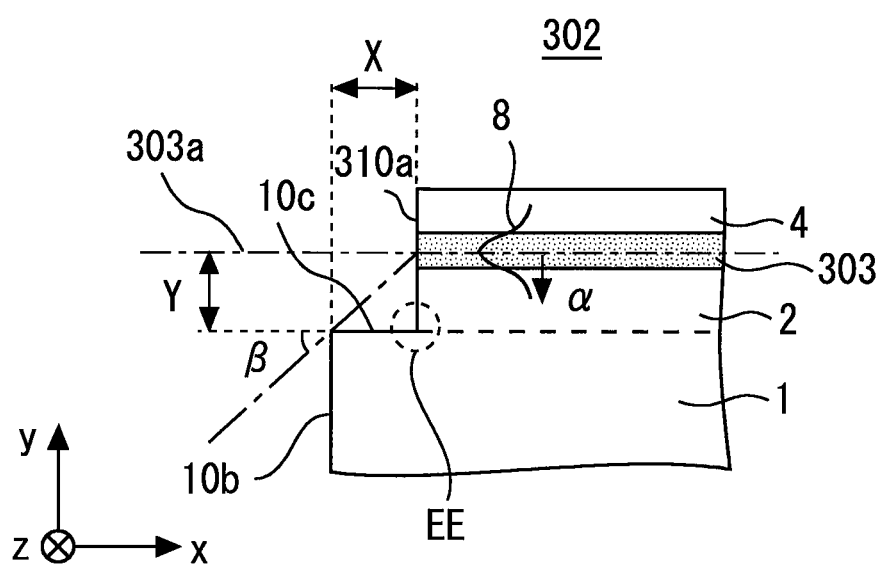
FIG. 20 is a partially enlarged view showing the configuration of the external resonator type semiconductor laser device according to the third embodiment.

FIG. 18 is a perspective view showing a configuration of an external resonator type semiconductor laser device 301 according to a third embodiment. FIG. 18 is a perspective view of the external resonator type semiconductor laser device 301 as viewed from the rear facet 10 side, and is different in the viewing direction for the device from FIG. 1. FIG. 19 is a cross-sectional view showing the configuration of the external resonator type semiconductor laser device 301 according to the third embodiment. FIG. 19 is a cross-sectional view of the external resonator type semiconductor laser device 301 which is cut along a B-B virtual plane of FIG. 18. FIG. 20 is a partially enlarged view showing the configuration of the external resonator type semiconductor laser device 301 according to the third embodiment. FIG. 20 is an enlarged view of a vicinity 302 of the rear facet of FIG. 19.

The external resonator type semiconductor laser device 301 is similar to the semiconductor laser device 201 according to the second embodiment in that the protruding portion 10b and the stepped bottom surface portion 10c are provided by etching the rear facet 10. However, the external resonator type semiconductor laser device 301 is greatly different from the semiconductor laser device 201 in that it includes a semiconductor laser portion 301a and an optical waveguide portion 301b.

As shown in FIG. 19, the external resonator type semiconductor laser device 301 is sectioned into the semiconductor laser portion 301a on the front facet 7 side and the optical waveguide portion 301b on the rear facet 10 side at a position that is approximately half the resonator length. As in the case of the second embodiment, the semiconductor laser portion 301a is a portion provided with a first conductivity type cladding layer 2, an active layer 3, a second conductivity type cladding layer 4, and a first ohmic electrode 5 on a semiconductor substrate 1. Further, the optical waveguide portion 301b is different from the semiconductor laser portion 301a in two points. A first different point resides in that the optical waveguide portion 301b is provided with an optical waveguide layer 303 instead of the active layer 3. The material of the optical waveguide layer 303 has a refractive index larger than those of the first conductivity type cladding layer 2 and the second conductivity type cladding layer 4. A second different point resides in that the first ohmic electrode 5 is not provided on the optical waveguide portion 301b.

In the second embodiment, the resonator facet portion 10a is included in the rear facet 10, but in the third embodiment, the optical waveguide facet portion 310a which is the end face of the optical waveguide layer 303 is included in the rear facet 10. Laser light output from the end face of the active layer 3 is transmitted to the optical waveguide layer 303, and this laser light is reflected at the optical waveguide facet portion 310a of the optical waveguide layer 303. The laser light reflected at the optical waveguide facet portion 310a enters the active layer 3 again, and is finally emitted from the front facet 7.

As shown in the vicinity 302 of the rear facet portion in FIG. 20, an optical waveguide layer thickness central axis 303a is set. This optical waveguide layer thickness central axis 303a is an axis passing through the center in the thickness direction of the optical waveguide layer 303, and corresponds to the active layer thickness central axis 3a in the first and second embodiments. In addition, reference signs indicated in FIG. 20 correspond to reference signs indicated in FIG. 14. The respective parameters X, Y, β, α, etc., in FIG. 20 can be set by the same method for the respective parameters X, Y, β, α, etc., indicated in the first and second embodiments and the modifications thereof. The relationship between the electric field intensity and the bottom surface portion depth Y at the etching edge corner portion EE can also be addressed according to the same method as described in the first and second embodiments. In the third embodiment, the bottom surface portion depth Y is also set to be equal to or larger than the specific depth $y_{1/100}$.

Note that in the third embodiment, the reflective coating film 209 in the second embodiment may be added. By applying the reflective coating film 209, the guided light 8 guided through the optical waveguide layer 303 may be reflected at the optical waveguide facet portion 310a.

REFERENCE SIGNS LIST

1 Semiconductor substrate
2 First conductivity type cladding layer
3 Active layer
3a Active layer thickness central axis
4 Second conductivity type cladding layer
5 First ohmic electrode
6 Second ohmic electrode
7 Front facet
7a Resonator facet portion
7b Protruding portion
7c Stepped bottom surface portion
8 Guided light
10 Rear facet
10a Resonator facet portion
10b Protruding portion
10c Stepped bottom surface portion
101,131,141,201 Semiconductor laser device
102 Vicinity of resonator facet portion
111 Laser radiation
209 Reflective coating film
301 External resonator type semiconductor laser device
301a Semiconductor laser portion
301b Optical waveguide portion
303 Optical waveguide layer
303a Optical waveguide layer thickness central axis
310a Optical waveguide facet portion
EE Etching edge corner portion
X Predetermined protrusion amount
Y Bottom surface portion depth

The invention claimed is:
1. A semiconductor laser device comprising:
a semiconductor substrate;
a first conductivity type cladding layer provided on the semiconductor substrate;
an active layer provided on the first conductivity type cladding layer; and a second conductivity type cladding layer provided on the active layer, wherein the semiconductor laser device has a front facet and a rear facet that face in opposite directions to each other, wherein each of the front facet and the rear facet contains an end portion of the semiconductor substrate, an end portion of the first conductivity type cladding layer, an end portion of the active layer and an end portion of the second conductivity type cladding layer, wherein at least one of the front facet and the rear facet includes a resonator facet portion containing the end portion of the active layer, and a protruding portion protruding in a resonator length direction beyond the resonator facet portion by a predetermined protrusion amount and having a stepped bottom surface portion that faces a side of the resonator facet portion, wherein the resonator facet portion and the stepped bottom surface portion are connected to each other to form a corner portion, wherein a shortest distance from an active layer thickness central axis as a virtual line representing a thickness center position of the active layer to the stepped bottom surface portion is defined as a bottom surface portion depth, wherein the bottom surface portion depth is set to be equal to a predetermined specific depth or deeper than the specific depth, wherein the specific depth is a shortest distance from the active layer thickness central axis to a position at which guided light guided through the active layer has $1/100$ of a peak intensity value in a light intensity distribution of a vertical transverse mode of the guided light, wherein when the predetermined protrusion amount is represented by X, the bottom surface portion depth is represented by Y, and a half angle of a spread angle of laser light emitted from the resonator facet portion is represented by $\beta$, the predetermined protrusion amount and the bottom surface portion depth are determined so as to satisfy $\beta<\arctan(Y/X)$, wherein $\beta$ is set within $0<\beta<\beta1$, wherein $\beta1$ is an angle corresponding to a point at which a first characteristic line and a second characteristic line cross each other in a graph having an axis of $\beta$ and an axis of Y, wherein the first characteristic line is configured to define in the graph a condition in which laser radiation emitted from the resonator facet portion does not apply to the protruding portion, wherein the second characteristic line is configured to define in the graph a condition in which the bottom surface portion depth Y has a depth deeper than the specific depth, and wherein the bottom surface portion depth Y is set equal to or larger than a value on the second characteristic line.

2. A semiconductor laser device comprising:
a semiconductor substrate;
a first conductivity type cladding layer provided on the semiconductor substrate;
an active layer provided on the first conductivity type cladding layer; and
a second conductivity type cladding layer provided on the active layer,
wherein the semiconductor laser device has a front facet and a rear facet that face in opposite directions to each other, wherein each of the front facet and the rear facet contains an end portion of the semiconductor substrate, an end portion of the first conductivity type cladding layer, an end portion of the active layer and an end portion of the second conductivity type cladding layer, wherein the rear facet includes a resonator facet portion containing the end portion of the active layer, and a protruding portion protruding in a resonator length direction beyond the resonator facet portion by a predetermined protrusion amount and having a stepped bottom surface portion that faces a side of the resonator facet portion, wherein a reflective coating film for reflecting light guided through the active layer at the resonator facet portion is provided on the resonator facet portion, wherein the resonator facet portion and the stepped bottom surface portion are connected to each other to form a corner portion, wherein a shortest distance from an active layer thickness central axis as a virtual line representing a thickness center position of the active layer to the stepped bottom surface portion is defined as a bottom surface portion depth, wherein the bottom surface portion depth is set to be equal to a predetermined specific depth or deeper than the specific depth, wherein the specific depth is a shortest distance from the active layer thickness central axis to a position at which guided light guided through the active layer has $1/100$ of a peak intensity value in a light intensity distribution of a vertical transverse mode of the guided light, wherein when the predetermined protrusion amount is represented by X, the bottom surface portion depth is represented by Y, and a half angle of a spread angle of laser light emitted from the resonator facet portion when the reflective coating film is not provided is represented by $\beta$, wherein $\beta$ is set so as to be $\beta1<\beta$, wherein $\beta$ is an angle corresponding to a point at which a first characteristic line and a second characteristic line cross each other in a graph having an axis of $\beta$ and an axis of Y, wherein the first characteristic line is configured to define in the graph a condition in which laser radiation emitted from the resonator facet portion does not apply to the protruding portion when the reflective coating film is not provided, wherein the second characteristic line is configured to define in the graph a condition in which the bottom surface portion depth Y has a depth deeper than the specific depth, and wherein the bottom surface portion depth Y is set smaller than a value on the first characteristic line and equal to or larger than a value on the second characteristic line.

3. A semiconductor laser device comprising:
a semiconductor substrate;
a first conductivity type cladding layer provided on the semiconductor substrate;
an active layer provided at a first portion on the first conductivity type cladding layer;
an optical waveguide layer that is provided at a second portion adjacent to the first portion on the first conductivity type cladding layer and connected to an end portion of the active layer; and
a second conductivity type cladding layer provided on the active layer and the optical waveguide layer, wherein the semiconductor laser device has a front facet and a rear facet that face in opposite directions to each other, wherein the front facet contains an end portion of the semiconductor substrate, an end portion of the first conductivity type cladding layer, an end portion of the active layer and an end portion of the second conductivity type cladding layer, wherein the rear facet contains an end portion of the semiconductor substrate, an end portion of the first conductivity type cladding layer, an end portion of the optical waveguide layer and an end portion of the second conductivity type cladding layer, wherein the rear facet includes an optical waveguide facet portion containing the end portion of the optical waveguide layer, and a protruding portion having a stepped bottom surface portion that protrudes in a resonator length direction beyond the optical waveguide facet portion by a predetermined protrusion amount and faces a side of the optical waveguide facet portion, wherein the optical waveguide facet portion and the stepped bottom surface portion are connected to each other to form a corner portion, wherein a shortest distance from an optical waveguide layer thickness central axis as a virtual line representing a thickness center position of the optical waveguide layer to the stepped bottom surface portion is defined as a bottom surface portion depth, wherein the bottom surface portion depth is set to be equal to a predetermined specific depth or deeper than the specific depth, and wherein the specific depth is a shortest distance from the optical waveguide layer thickness central axis to a position at which guided light guided through the optical waveguide layer has 1/100 of a peak intensity value in a light intensity distribution of a vertical transverse mode of the guided light, wherein when the predetermined protrusion amount is represented by X, the bottom surface portion depth is represented by Y, and a half angle of a spread angle of laser light emitted from the optical waveguide facet portion is represented by $\beta$, the predetermined protrusion amount and the bottom surface portion depth are determined so as to satisfy $\beta<\arctan(Y/X)$, wherein $\beta$ is set within $0<\beta<\beta 1$, wherein $\beta 1$ is an angle corresponding to a point at which a first characteristic line and a second characteristic line cross each other in a graph having an axis of $\beta$ and an axis of Y, wherein the first characteristic line is configured to define in the graph a condition in which laser radiation emitted from the optical waveguide facet portion does not apply to the protruding portion, wherein the second characteristic line is configured to define in the graph a condition in which the bottom surface portion depth Y has a depth deeper than the specific depth, and wherein the bottom surface portion depth Y is set equal to or larger than a value on the second characteristic line.

* * * * *